United States Patent [19]

Ogawa et al.

[11] Patent Number: 5,781,463
[45] Date of Patent: Jul. 14, 1998

[54] ADAPTIVE DIGITAL FILTER WITH HIGH SPEED AND HIGH PRECISION COEFFICIENT SEQUENCE GENERATION

[75] Inventors: Tetsuya Ogawa; Naoki Kato, both of Chiba; Shinya Akashi, Tokyo, all of Japan

[73] Assignee: Sharp Kabushiki Kaisha, Osaka, Japan

[21] Appl. No.: 731,235

[22] Filed: Oct. 11, 1996

[30] Foreign Application Priority Data

Mar. 29, 1996 [JP] Japan ................................ 8-077284

[51] Int. Cl.$^6$ .................................................. G06F 17/10
[52] U.S. Cl. ................................................ 364/724.19
[58] Field of Search ......................... 364/724.19, 724.2; 375/231–233, 235

[56] References Cited

U.S. PATENT DOCUMENTS 5,058,047  10/1991  Chung ............................ 364/724.19
5,278,780  1/1994  Eguchi ........................... 364/724.19

FOREIGN PATENT DOCUMENTS 5-48499  2/1993  Japan .

OTHER PUBLICATIONS

"Joint Blind Equalization, Carrier Recovery, and Timing Recovery for High–Order QAM Signal Constellations," by Neil K. Jablon, IEEE Transcations on Signal Processing, vol. 40, No.6, Jun. 1992, pp. 1383–1398.

United States Advanced Television Systems Committee, draft Guide to the Use of the Digital Television Standard for HDTV Transmission Feb. 24, 1995, pp. 110–111.

Primary Examiner—Tan V. Mai

[57] ABSTRACT

An adaptive digital filter includes a finite impulse response digital filter for performing a convolution calculation by multiplying a code sequence with a coefficient sequence, and a coefficient calculation unit for performing the updating calculation of the coefficient sequence only when the calculation result of the finite impulse response digital filter belongs to a predetermined numerical value region other than numerical value regions which are defined in advance in correspondence with code values of the code sequence. Thus, a coefficient sequence is generated at high speed and with high precision without making the calculation result of the coefficient sequence diverge even for a code sequence in which considerable intersymbol interference has occurred due to disturbance on the transmission path, and the intersymbol interference can be removed.

13 Claims, 9 Drawing Sheets

ADAPTIVE DIGITAL FILTER WITH HIGH SPEED AND HIGH PRECISION COEFFICIENT SEQUENCE GENERATION

BACKGROUND OF THE INVENTION

(1) Field of the Invention

The present invention relates to an adaptive digital filter and, more particularly, to an adaptive digital filter which is suitable for an adaptive equalizer or the like in a digital communication apparatus that uses vestigial sideband (to be abbreviated as "VSB" hereinafter) modulation, quadrature amplitude modulation (to be abbreviated as "QAM" hereinafter), or the like.

(2) Description of the Background Art

Nowadays, attempts are being made worldwide to realize television broadcasting using a digital transmission technique. When such television broadcasting is realized as terrestrial broadcasting, intersymbol interference due to reflected waves, i.e., ghost, poses a serious problem, and an adaptive digital filter is used for eliminating this ghost.

The adaptive digital filter means a digital filter that performs convolution calculation processing by appropriately controlling a coefficient sequence to be multiplied with a code sequence in accordance with the signal state of the code sequence input as an input signal, and realizes appropriate filter characteristics corresponding to the signal state of an input signal that changes with time.

The adaptive digital filter is normally constituted using a finite impulse response feedforward digital filter (to be referred to as an "FIR digital filter" hereinafter) and an infinite impulse response feedback digital filter (to be referred to as an "IIR digital filter hereinafter).

In the following description, a variable n indicates a natural number which time-sequentially corresponds to codes of a code sequence to be input to the adaptive digital filter.

FIG. 1 shows the arrangement of a conventional typical adaptive digital filter. The conventional adaptive digital filter shown in FIG.1 comprises an FIR digital filter 1 that performs a convolution calculation by multiplying an input code sequence U(n) [u(n+K1), u(n+K1−1), . . . , u(n)] with a coefficient sequence $C_k(n)$ [$c_{-K1}(n)$, $c_{-K1+1}(n)$, . . . , $c_0(n)$], an IIR digital filter 2 that performs a convolution calculation by multiplying an estimated value sequence W(n) [w(n), . . . , w(n−K2−1), w(n−K2)] input from a slicer 4 (to be described later) with a coefficient sequence $C_k(n)$ [$c_1(n)$, . . . , $c_{K2-1}(n)$, $c_{K2}(n)$], an adder 3 for adding the calculation results from the FIR and IIR digital filters 1 and 2, a slicer 4 for outputting an estimated value w(n) on the basis of the sum output from the adder 3, a subtracter 5 for subtracting the sum output from the adder 3 from the estimated value w(n) output from the slicer 4 and outputting an error value e(n), and a multiplier 7 for multiplying the error value e(n) calculated by the subtracter 5 with a convergence coefficient α to generate the coefficient sequence $C_k(n)$ [$c_{K1}(n)$, $c_{K1+1}(n)$, . . . , $c_0$, $c_1(n)$, . . . , $c_{K2-1}(n)$, $c_{K2}(n)$]. Note that the output from the adder 3 serves as the output from this conventional adaptive digital filter, and this calculation result is output as an equalization signal y(n) to an external device.

The FIR digital filter 1 shown in FIG.1 comprises unit delay elements 40 cascade-connected between adjacent taps, multipliers 41 for respectively multiplying the code values of the code sequence U(n) [u(n+K1), u(n+K1−1), . . . , u(n)] appearing at the respective taps with the coefficient values of the coefficient sequence $C_k(n)$ [$c_{K1}(n)$, $c_{K1+1}(n)$, . . . , $c_0(n)$], integrators 42 for respectively integrating the products output from the multipliers 41 of the respective taps, multipliers 43 for respectively multiplying code values u(x) {x=n+K1, n+K1−1, . . . , n} appearing at the respective taps with the integration results output from the integrators 42, and an adder 44 for receiving the products output from the multipliers 43 of the respective taps, and adding the products. Note that a constant K1 indicates a value obtained by subtracting 1 from the number of taps of the FIR digital filter 1.

The IIR digital filter 2 also has substantially the same arrangement as that of the above-mentioned FIR digital filter 1, except that the input code value is the estimated value w(n) output from the slicer 4, and the coefficient values of the coefficient sequence $C_k(n)$ to be multiplied with the code values of the respective taps are $c_1(n)$, . . . , $c_{K2-1}(n)$, $c_{K2}(n)$. Note that a constant K2 indicates the number of taps of the IIR digital filter 2.

The operation of the conventional adaptive digital filter with the above arrangement will be described in detail below with reference to FIG. 1.

Referring to FIG. 1, when a code sequence U(n) [u(n+K1), u(n+K1−1), . . . , u(n)] is input to the conventional adaptive digital filter, the FIR digital filter 1 performs convolution calculation processing by multiplying code values u(x) {x=n+K1, n+K1−1, . . . , n} of the code sequence U(n) with coefficient values $c_k(n)$ {k=−K1, −K1+1, . . . , 0}.

More specifically, the code values of the input code sequence U(n) are delayed by the unit delay elements 40 constituting the FIR digital filter 1, code values u(n+K1), u(n+K1−1), . . . , u(n+1) appear in turn from the taps on the front stage side, and a code value u(n) appears at the tap of the final stage. The multipliers 41 multiply code values u(x) appearing at the respective taps with the coefficient values $c_k(n)$.

The products output from the multipliers 41 at the respective taps are integrated by the integrators 42, and the multipliers 43 multiply the integration results output from the integrators 42 with the code values appearing at the respective taps. The adder 44 adds the products output from the multipliers 43 of the respective taps, and outputs the sum as a calculation result $y_1(n)$ of the FIR digital filter 1.

On the other hand, the IIR digital filter 2 receives an estimated value sequence W(n) [w(n), . . . , w(n−K2−1), w(n−K2)] (to be described later), and similarly performs convolution calculation processing by respectively multiplying estimated values w(n), w(n−K2−1), w(n−K2) appearing at the respective taps with coefficient values $c_1(n)$, . . . , $c_{K2-1}(n)$, $c_{K2}(n)$. The adder 44 constituting the final stage of the IIR digital filter 2 adds the calculation results of the respective taps, and outputs the sum as a calculation result $y_2(n)$ of the IIR digital filter 2.

The adder 3 receives the calculation results $y_1(n)$ and $y_2(n)$ from the FIR and IIR digital filters 1 and 2, and adds them to output a sum y(n).

The slicer 4 receives the sum y(n) output from the adder 3, and outputs an estimated value w(n) which is most approximate to the sum y(n).

The estimated value w(n) output from the slicer 4 represents a value obtained when the receiver estimates a code value of a code sequence transmitted from the transmitter. More specifically, the code sequence U(n) to be received by the receiver is modulated as a result of various types of disturbance on the transmission path, and becomes different from that transmitted from the transmitter. The estimated value w(n) represents a code value which is estimated to be received by the receiver if there is no disturbance on the transmission path, and the slicer 4 selects and outputs, as the estimated value w(n), a code value closest to an actually received code value from normal code values, which are agreed upon in advance between the transmitter and receiver.

The subtracter 5 then subtracts the estimated value w(n) output from the slicer 4 from the sum y(n) output from the adder 3, and outputs an error value e(n). More specifically, the subtracter 5 calculates an error generated in the code value y(n) to be output from the receiver due to disturbance on the transmission path that acts on the code value transmitted from the transmitter.

The multiplier 7 generates a coefficient sequence $C_k(n)$ by multiplying the error value e(n) output from the subtracter 5 with a convergence coefficient $\alpha$, and supplies coefficient values of the generated coefficient sequence $C_k(n)$ to the multipliers 41 constituting the FIR and IIR digital filters 1 and 2. At this time, coefficient values $C_{-K1}(n)$; $C_{-K1+1}(n)$; ... ; $C_0$; $C_1(n)$; ... $C_{K2-1}(n)$; $C_{K2}(n)$ of the coefficient sequence $C_k(n)$ are calculated and generated so that the error value e(n) output from the subtracter 5 converges to a minimum value.

The above-mentioned operation can be expressed by formula (1) below:

$$y(n) = \sum_{k=-K1}^{0} c_k(n)u(n-k) + \sum_{k=1}^{K2} c_k(n)w(n-k) \quad (1)$$

The method of generating the coefficient sequence $C_k(n)$ when the adaptive digital filter is used as an adaptive equalizer in a data transmission system will be explained below.

Assume that a code value u(n) is an input signal received from the transmission path, and the input signal u(n) is subjected to disturbance by a disturbance signal on the transmission path. The disturbance amount of the disturbance signal on the input signal u(n) depends on the characteristics of the transmission path. More specifically, the disturbance signal is modulated by the characteristic function of the transmission path, and influences the signal level of a code sequence on the transmission path.

Therefore, in order to remove the disturbance signal components superimposed on the input signal u(n) on the transmission path, the receiver need only realize the inverse function of the characteristic function of the transmission path, and process the input signal u(n). For this purpose, the coefficient sequence $C_k(n)$ is generated so that the characteristics of the adaptive digital filter realize the inverse function of the characteristic function of the transmission path with respect to the disturbance signal. As a result, the coefficient sequence $C_k(n)$ is sequentially updated to minimize the error value e(n), and finally converges to a value from which the disturbance on the transmission path is removed.

As a typical algorithm for generating the coefficient sequence $C_k(n)$ to realize the inverse function of the characteristic function of the transmission path, an LMSE (Least Mean Square Error Method) algorithm is known. This algorithm pays attention to a square mean error D, and generates the coefficient sequence $C_k(n)$ to minimize the square mean error D. The square mean error D is a quantity defined by the following formula (2):

$$D = \{e(n)\}^2 \quad (2)$$

Using the square mean error D defined as described above, each coefficient $c_k$ of the coefficient sequence $C_k(n)$ is calculated from formulas (3a) and (3b) below. More specifically, the coefficient value $c_k$ is repetitively calculated until the error value e(n) in formulas (3a) and (3b) converges to a minimum value, and all the coefficient values of the coefficient sequence $C_k(n)$ are finally obtained.

$$\begin{aligned} c_k(n+1) &= c_k(n) - \alpha \delta D/\delta c_k(n) \\ &= c_k(n) + \alpha u(n-k)e(n) \quad \{k=-K1 \text{ to } 0\} \quad (3a) \\ &= c_k(n) + \alpha w(n-k)e(n) \quad \{k=1 \text{ to } K2\} \quad (3b) \end{aligned}$$

Formula (3a) is one for calculating the coefficient sequence to be applied to the FIR digital filter 1, and formula (3b) is one for calculating the coefficient sequence to be applied to the IIR digital filter 2. Note that a constant $\alpha$ indicates a convergence coefficient, and is set to be a small, positive value.

On the other hand, the error value e(n) is given by formula (4) below since it is the difference between the estimated value w(n) and the output value y(n):

$$I(I) = I(I) - I(I) \quad (4)$$

Formula (4) is calculated in the process of calculating the coefficient sequence $C_k(n)$ to minimize the error value e(n), and the following two different coefficient sequence calculation methods are known which differ in the way of defining the estimated value w(n) in formula (4).

A) Training Sequence Method

This calculation method can be used when a portion of a code sequence to be transmitted includes a reference signal of a pattern corresponding to a predetermined code value, and the estimated value w(n) is calculated based on this training sequence to update a coefficient sequence.

B) Symbol Decision Method

In this calculation method, the actually received code value is defined as the one with maximum likelihood, and is used as an estimated value w(n).

As one of characteristics required for a television receiver, a reception image is to be obtained within a short period of time after the power switch is turned on or a channel is switched. This period of time depends on the convergence time of the calculation of the coefficient sequence $C_k(n)$. Therefore, in order to improve the characteristics of the television receiver, the calculation time of the coefficient sequence $C_k(n)$ must be shortened.

From this point of view, merits and demerits of the training sequence method and the symbol decision method of the LMSE algorithm will be explained.

According to the training sequence method, since a correct estimated value w(n) is guaranteed, theoretically, the calculation result always converges without divergence. However, if the ratio of the training sequence in a code sequence to be transmitted increases, the code transfer efficiency lowers. For this reason, in practice, the training sequence can only be included in a code sequence at a very small ratio (e.g., about 1/500) with respect to all the codes to be transmitted. For this reason, much time is required to calculate the coefficient sequence.

On the other hand, according to the symbol decision method, since the calculation can be made using all the codes to be transmitted, the calculation result converges within a very short period of time. However, if the estimated value w(n) has a large difference from the actually transmitted code due to disturbance such as intersymbol interference, the calculation result of the coefficient sequence $C_k(n)$ readily diverges.

For example, when the received code signal is the one that is expressed by a constellation free from any intersymbol interference, as shown in FIG. 2B, since no error occurs upon discrimination of the code value, the calculation result of the coefficient sequence converges at high speed using the symbol decision method.

However, when the received code signal is the one expressed by a constellation suffering intersymbol interference, as shown in FIG. 2C, since errors frequently occur upon discrimination of the code value, the calculation result of the coefficient sequence $C_k(n)$ does not converge, and may diverge in the worst case.

Note that the constellation shown in FIG. 2A is that of a signal free from any intersymbol interference, and is an example of an ideal constellation.

As described above, according to the adaptive digital filter using the LMSE algorithm based on the training sequence method, much time is required until the calculation result of the coefficient sequence $C_k(n)$ converges. On the other hand, according to the adaptive digital filter using the LMSE algorithm based on the symbol decision method, considerable intersymbol interference cannot be coped with.

SUMMARY OF THE INVENTION

The present invention has been made in consideration of the above-mentioned problems and has as its object to provide an adaptive digital filter that can remove intersymbol interference by generating a coefficient sequence at high speed and with high precision, even for a code sequence suffering considerable intersymbol interference, without divergence of the calculation result of the coefficient sequence.

In order to achieve the above object, the present invention comprises the following arrangement.

According to the first aspect of the present invention, there is provided an adaptive digital filter for removing intersymbol interference generated in a code sequence in a transmission path, comprising finite impulse response digital filter means for performing a convolution calculation by multiplying the code sequence with a coefficient sequence, and coefficient calculation means for, when a calculation result from the finite impulse response digital filter means belongs to a predetermined numerical value region other than a plurality of numerical value regions which are defined in advance in correspondence with code values of the code sequence, generating the coefficient sequence on the basis of a predetermined value which belongs to one of the plurality of numerical value regions closest to the predetermined numerical value region.

According to the second aspect of the present invention, there is provided an adaptive digital filter for removing intersymbol interference generated in a code sequence in a transmission path, comprising finite impulse response digital filter means for performing a convolution calculation by multiplying the code sequence with a coefficient sequence, addition means for receiving a calculation result from the finite impulse response digital filter means as one input value, and adding another input value to the one input value, coefficient calculation means for, when a sum output from the addition means belongs to a predetermined numerical value region other than a plurality of numerical value regions which are defined in advance in correspondence with code values of the code sequence, generating the coefficient sequence on the basis of a predetermined value which belongs to one of the plurality of numerical value regions closest to the predetermined numerical value region, and for, when the sum output from the addition means belongs to one of the plurality of numerical value regions, generating the coefficient sequence on the basis of a predetermined value that belongs to the numerical value region to which the sum belongs, and infinite impulse response digital filter means for performing a convolution calculation by multiplying a sequence of the predetermined values with the coefficient sequence, and supplying the calculation result to the addition means as the other input value.

In an adaptive digital filter according to the third aspect of the present invention, the coefficient calculation means of the adaptive digital filter of the first aspect comprises a discrimination unit for discriminating the numerical value region to which the calculation result of the finite impulse response digital filter means belongs from the plurality of numerical value regions which are defined in advance in correspondence with the code values of the code sequence, outputting a predetermined value that belongs to the discriminated numerical value region, and outputting an identification signal for identifying whether or not the calculation result belongs to the predetermined numerical value region, an error calculation unit for calculating a difference between the calculation result and the predetermined value, and outputting an error value, a selection unit for selecting and outputting the error value on the basis of the identification signal, and a coefficient sequence generation unit for generating the coefficient sequence on the basis of an output from the selection unit.

In an adaptive digital filter according to the fourth aspect of the present invention, the coefficient calculation means of the adaptive digital filter of the second aspect comprises a discrimination unit for discriminating the numerical value region to which the sum output from the addition means belongs from the plurality of numerical value regions which are defined in advance in correspondence with the code values of the code sequence, outputting a predetermined value that belongs to the discriminated numerical value region, and outputting an identification signal for identifying whether or not the sum belongs to the predetermined numerical value region, an error calculation unit for calculating a difference between the sum and the predetermined value, and outputting an error value, a selection unit for selecting and outputting the error value on the basis of the identification signal, and a coefficient sequence generation unit for generating the coefficient sequence on the basis of an output from the selection unit.

In an adaptive digital filter according to the fifth aspect of the present invention, the coefficient calculation means of the adaptive digital filter of the first or second aspect updates a central value in the coefficient sequence on the basis of an error value of the calculation result from the finite impulse response digital filter means with respect to a training sequence included in the code sequence during an input period of the training sequence.

In an adaptive digital filter according to the sixth aspect of the present invention, the coefficient sequence generation unit of the adaptive digital filter of the third or fourth aspect updates a central value in the coefficient sequence on the basis of an error value of the calculation result from the finite impulse response digital filter means with respect to a training sequence included in the code sequence during an input period of the training sequence.

In an adaptive digital filter according to the seventh aspect of the present invention, the selection unit of the adaptive digital filter of the third or fourth aspect selects the error value on the basis of convergence/non-convergence of a training sequence during an input period of the training sequence included in the code sequence, independently of the identification signal.

In an adaptive digital filter according to the eighth aspect of the present invention, the selection unit of the adaptive digital filter of the third or fourth aspect selects the error value on the basis of convergence/non-convergence of a training sequence during an input period of the training sequence included in the code sequence, independently of the identification signal, and the coefficient sequence generation unit updates a central value in the coefficient sequence on the basis of an error value of the calculation result from the finite impulse response digital filter means with respect to a training sequence during an input period of the training sequence included in the code sequence.

In an adaptive digital filter according to the ninth aspect of the present invention, the predetermined numerical value region of the adaptive digital filter of the first or second aspect is a numerical value region having a value larger than a value that belongs to the numerical value region defined in correspondence with a code value with a maximum absolute value.

In an adaptive digital filter according to the 10th aspect of the present invention, the predetermined numerical value region of the adaptive digital filter of the third or fourth aspect is a numerical value region having a value larger than a value that belongs to the numerical value region defined in correspondence with a code value with a maximum absolute value.

In an adaptive digital filter according to the 11th aspect of the present invention, the coefficient sequence generation unit of the adaptive digital filter of the third or fourth aspect generates the coefficient sequence to minimize an error value.

The functions of the adaptive digital filters according to the first to 11th aspects of the present invention will be described below.

With the adaptive digital filter according to the first aspect of the present invention, when the calculation result of the finite impulse response digital filter means with respect to an input code sequence does not belong to any of the plurality of numerical value regions which are defined in advance in correspondence with the code values of the code sequence, and belongs to the predetermined numerical value region, a coefficient sequence is generated on the basis of a predetermined value that belongs to a numerical value region closest to the predetermined numerical value region. At this time, when the numerical value level of the code value increases due to disturbance, most of the code values belonging to the predetermined regions are those belonging to the numerical value region closest to the predetermined numerical value region. Hence, it is highly probable that the predetermined value is an original value of the code value whose numerical value level has increased due to the disturbance. Therefore, by generating the coefficient sequence based on the predetermined value, a high-precision coefficient sequence can be obtained.

With the adaptive digital filter according to the second aspect of the present invention, when the sum of the calculation result of the finite impulse response digital filter means and the calculation result of the infinite impulse response digital filter means with respect to an input code sequence does not belong to any of the plurality of numerical value regions which are defined in advance in correspondence with the code values of the code sequence, and belongs to the predetermined numerical value region, a coefficient sequence is generated on the basis of a predetermined value that belongs to a numerical value region closest to the predetermined numerical value region. At this time, when the numerical value level of the code value increases due to disturbance, most of the code values belonging to the predetermined regions are those belonging to the numerical value region closest to the predetermined numerical value region. Hence, it is highly probable that the predetermined value is an original value of the code value whose numerical value level has increased due to disturbance. Therefore, by generating the coefficient sequence based on the predetermined value, a high-precision coefficient sequence can be obtained. Also, since the calculation result obtained by the convolution calculation of the infinite impulse response digital filter means by multiplying a predetermined value sequence in the numerical value region with a coefficient sequence is fed back to and added to the calculation result of the finite impulse response digital filter means, amplification of linear noise can be suppressed in a process of generating a coefficient sequence by the coefficient calculation means.

With the adaptive digital filter according to the third aspect of the present invention, when the calculation result of the finite impulse response digital filter means belongs to the predetermined numerical value region, the discrimination unit outputs a predetermined value that belongs to a numerical value region of the plurality of numerical value regions closest to the predetermined numerical value region, and outputs an identification signal for identifying whether or not the calculation result belongs to the predetermined numerical value region. The error calculation unit outputs an error value of the calculation result from the predetermined value. When the calculation result belongs to the predetermined numerical value region, the selection unit is controlled by the identification signal to select the error value, and supplies the error value to the coefficient sequence generation unit. The coefficient sequence generation unit generates a coefficient sequence on the basis of the error value of the calculation result from the predetermined value in the predetermined numerical value region.

With the adaptive digital filter according to the fourth aspect of the present invention, when the sum output from the addition means belongs to the predetermined numerical value region, the discrimination unit outputs a predetermined value that belongs to a numerical value region of the plurality of numerical value regions closest to the predetermined numerical value region, and outputs an identification signal for identifying whether or not the calculation result belongs to the predetermined numerical value region. The error calculation unit outputs an error value of the calculation result from the predetermined value. When the calculation result belongs to the predetermined numerical value region, the selection unit is controlled by the identification signal to select the error value, and supplies the error value to the coefficient sequence generation unit. The coefficient sequence generation unit generates a coefficient sequence on the basis of the error value of the calculation result from the predetermined value in the predetermined numerical value region.

With the adaptive digital filter according to the fifth and sixth aspects of the present invention, since only the central value of a coefficient sequence is updated based on the training sequence included in the coefficient sequence, the calculation convergence time of the coefficient sequence can be shortened.

With the adaptive digital filter according to the seventh aspect of the present invention, since the convergence/non-convergence of the training sequence included in a code sequence is monitored, a coefficient sequence can be generated using code values which suffer less disturbance, and the calculation convergence time of the coefficient sequence can be further shortened.

With the adaptive digital filter according to the eighth aspect of the present invention, since the convergence/non-convergence of the training sequence included in a code sequence is monitored to generate a coefficient sequence using code values which suffer less disturbance, and only the central value of the coefficient sequence is updated based on the training sequence, the calculation convergence time of the coefficient sequence can be further shortened.

With the adaptive digital filter according to the ninth and 10th aspects of the present invention, since the predetermined numerical value region is a numerical value region having a value larger than that belonging to a numerical value region which is defined in correspondence with a code value with a maximum absolute value, when a code value which is to originally belong to the numerical value region which is defined in correspondence with the code value with the maximum absolute value belongs to the predetermined numerical value region under the influence of disturbance, the numerical value region to which the disturbed code value is to originally belong can be easily estimated with high precision.

With the adaptive digital filter according to the 11th aspect of the present invention, since a coefficient sequence is generated to minimize the error value, the coefficient sequence output that can remove disturbance can be obtained.

DESCRIPTION OF THE PREFERRED EMBODIMENTS

An adaptive digital filter according to the preferred embodiments of the present invention will be described hereinafter with reference to the accompanying drawings.

(First Embodiment)

Figure 1:
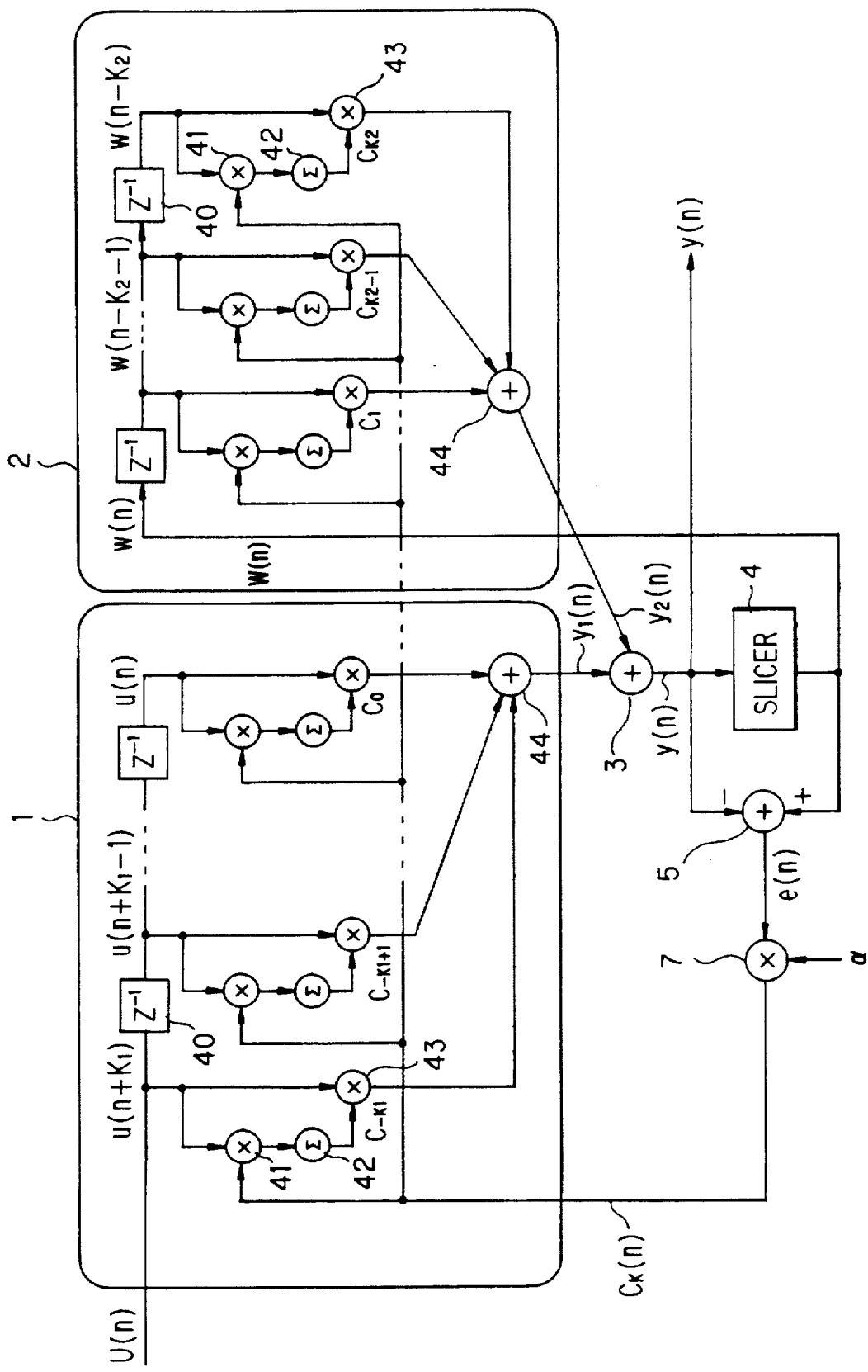
FIG. 1 is a block diagram showing the arrangement of a conventional adaptive digital filter.
Figure 3:
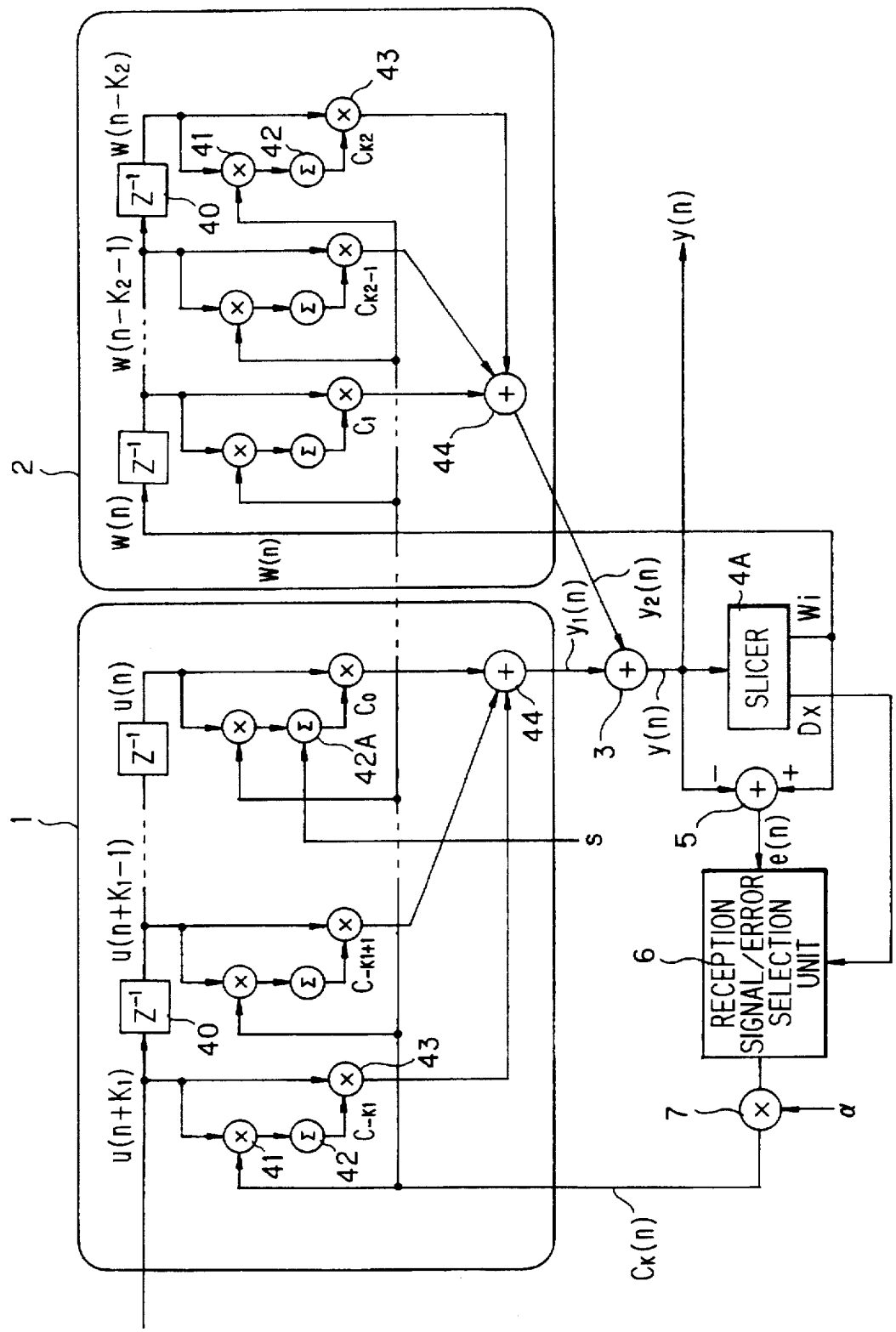
FIG. 3 is a block diagram showing the arrangement of an adaptive digital filter according to the first embodiment of the present invention.

FIG. 3 is a block diagram showing the arrangement of an adaptive digital filter according to the first embodiment of the present invention. FIG. 3 shows an example of the arrangement to be applied to transmission path waveform distortion correction. The same reference numerals in FIG. 3 denote the same parts as in the conventional digital filter shown in FIG. 1, and a detailed description thereof will be omitted. The adaptive digital filter of this embodiment has substantially the same arrangement as that of the conventional digital filter shown in FIG. 1, except that a slicer 4A is arranged in place of the slicer 4 shown in FIG. 1, a reception signal/error selection unit 6 is arranged at the output side of a subtracter 5, and an integrator 42A replaces the integrator at the center tap of the FIR digital filter 1.

Note that the integral operation of the integrator 42A is controlled by a control signal S, so that the integrator 42A is activated to perform an integral operation when the signal state of the control signal S is a logic value "1"; the integrator 42A is deactivated to hold the previous integrated value when the signal state of the control signal S is a logic value "0". In the description of this embodiment, assume that the signal state of the control signal S is fixed to the logic value "0", and the center tap coefficient is updated together with the coefficients of other taps.

The slicer 4A receives a sum y(n) output from an adder 3, and calculates and outputs an estimated value w(n) which is most approximate to the sum y(n). Upon calculating the estimated value w(n), the slicer 4A discriminates to which one of a numerical value region that is defined to have a normal code value free from any modulation due to disturbance as the central value and a predetermined numerical value region (to be described later) the sum y(n) output from the adder 3 belongs.

The slicer 4A outputs, as the estimated value w(n), a code value as the central value of the numerical value region with respect to a group of sums y(n) that belong to the numerical value region defined to have the normal code value as the central value. Also, the slicer 4A discriminates whether or not the sum y(n) output from the adder 3 belongs to the predetermined numerical value region (to be described later), and outputs an identification signal that reflects the discrimination result.

In the following description, a "numerical value region" means the numerical value region defined to have the normal code value as the central value, and is clearly distinguished from the "predetermined numeral value region" to be described later. The "numerical value region" and the "predetermined numeral value region" respectively correspond to numerical value regions $G_1$ to $G_8$ and regions X shown in FIG. 4.

The discrimination of the numerical value regions by the slicer 4A of the digital filter of this embodiment will be explained in more detail below with reference to FIG. 4. The above-mentioned estimated value w(n) is one of central values $W_i$ (i=1, 2, . . . , 8) of the numerical value regions $G_1$ to $G_8$, and is a value to be originally assumed by a code value u(n) of the received code sequence. Therefore, when the input code sequence is free from any disturbance on the transmission path, the received code value u(n) matches one of the estimated value w(n), i.e., one of the central values $W_i$ (i=1, 2, . . . , 8) of the numerical value regions $G_1$ to $G_8$.

However, when the input code sequence suffers disturbance on the transmission path, the signal level of the code sequence varies, and these values do not match with each other. Therefore, in this case, the original code value, i.e., the transmission code value must be estimated from the received code value u(n) suffering disturbance.

As described above, the numerical value regions are defined in advance to have normal code values as their central values. If the received code value u(n) belongs to one of these numerical value regions, this code value u(n) is determined as the one expressed by the central value of the numerical value region to which the code value belongs, and the central value of this numerical value region is determined as the estimated value w(n) of the received code value u(n).

The number of numerical value regions is determined by the number of levels that can be assumed by the code value in question. In the case of an 8 VSB code signal shown in FIG. 4 described above, the number of levels of the code value is 8, and central values $W_1$ to $W_8$ are respectively present at the centers of the numerical value regions $G_1$ to $G_8$.

Note that the central values may be determined as average levels of the numerical value regions $G_1$ to $G_8$, but may be determined at appropriate positions of the respective numerical value regions in correspondence with the characteristics of an input signal. Also, the numerical value range of each of the numerical value regions $G_1$ to $G_8$ may be appropriately determined in correspondence with the characteristics of the input signal.

Figure 4:
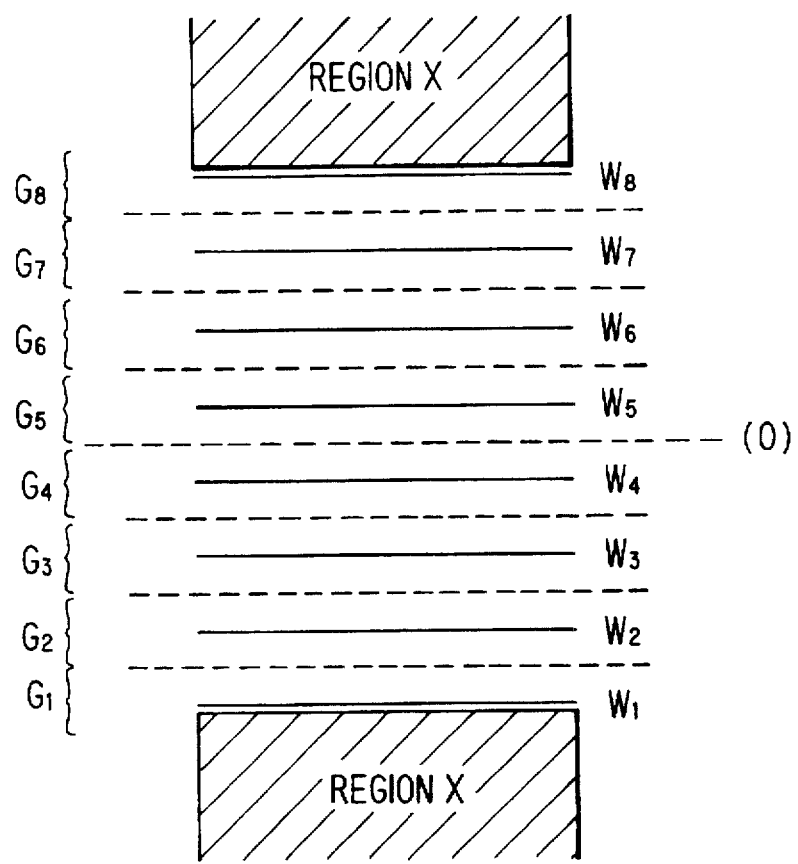
FIG. 4 is an explanatory view for explaining the relationship among the numerical value regions, the predetermined numerical value region, and the central values.

Numerical value regions indicated by regions X in FIG. 4 are those having values larger than the maximum numerical value region $G_8$ or smaller than the minimum numerical value region $G_1$. More specifically, when a signal with an excessively large amplitude (absolute value) is input due to, e.g., disturbance, the code value of this signal belongs to one of these regions X.

Figure 2:
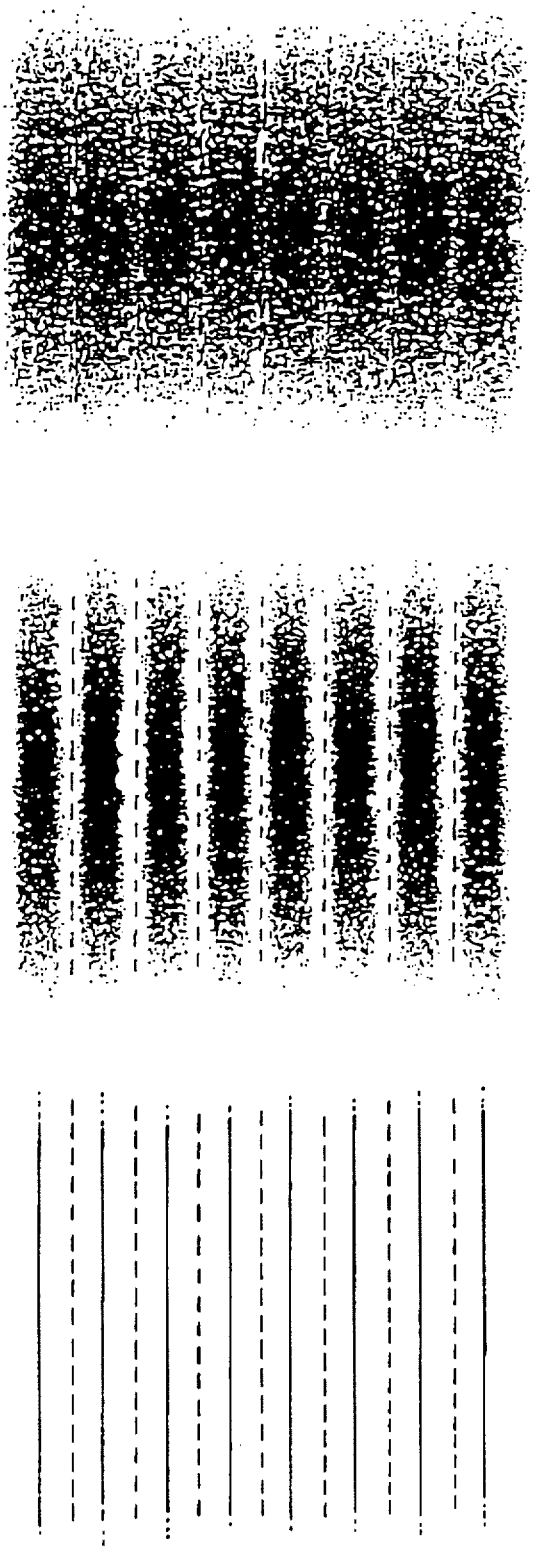
FIG. 2A is a view showing the constellation of a reception signal which is free from any intersymbol interference due to disturbance.
FIG. 2B is a view showing the constellation of a reception signal which suffers disturbance but has not caused any intersymbol interference yet.
FIG. 2C is a view showing the constellation of a reception signal which has caused an intersymbol interference due to disturbance.

The constellation shown in FIGS. 2A to 2C is that of an 8VSB code signal, and when an intersymbol interference has occurred due to, e.g., disturbance, the signal level of the code value varies and deviates from the central value of the corresponding numerical value region, as shown in FIG. 2B or 2C. If the interference amount is large, some signals may deviate to a numerical value region of the neighboring signal level.

In the following description, a "predetermined numerical value region" means the region X shown in FIG. 4, i.e., a numerical value region having values larger than the maximum numerical value region $G_8$ or smaller than the minimum numerical value region $G_1$, and is clearly distinguished from the above-mentioned "numerical value regions".

As described above, the slicer 4A shown in FIG. 3 obtains the estimated value w(n) {$W_i$} of the received code value u(n), and outputs it to the subtracter 5 and an IIR digital filter 2. Also, the slicer 4A discriminates if the code value u(n) belongs to one of the predetermined numerical value regions, and outputs an identification signal $D_x$ that reflects this discrimination result. The subtracter 5 subtracts the sum y(n) output from an adder 3 from the estimated value w(n) output from the slicer 4A to calculate an error value e(n). The reception signal/error selection unit 6 selects one of the error value e(n) output from the subtracter 5 and a predetermined value, and supplies the selected value to a multiplier 7 connected at its output side.

More specifically, when the code value u(n) belongs to none of the numerical value regions $G_1$ to $G_8$, the reception signal/error selection unit 6 outputs the error value e(n) supplied from the subtracter 5 under the control of the identification signal $D_x$ that reflects this fact. Conversely, when the code value u(n) belongs to one of the numerical value regions $G_1$ to $G_8$, the reception signal/error selection unit 6 outputs a predetermined value under the control of the identification signal $D_x$ that reflects this fact.

When the received code value u(n) belongs to one of the numerical value regions $G_1$ to $G_8$, for example, "zero" is set as the above-mentioned predetermined value to be output from the reception signal/error selection unit 6. This predetermined value need only express that the estimated value w(n) and the sum from the adder 3 match with each other, and may be appropriately determined in correspondence with calculation processing to be executed.

The operation of the adaptive digital filter of this embodiment which comprises the above-mentioned slicer 4A and the reception signal/error selection unit 6 will be explained below.

Referring to FIG. 3, a received code value u(n) is subjected to convolution calculation processing in the FIR digital filter 1, and a calculation result $y_1(n)$ serves as one input value of the adder 3.

The adder 3 receives a calculation result $y_2(n)$ from the IIR digital filter 2 (to be described later) as the other input value, and adds it to the calculation result $y_1(n)$ from the FIR digital filter 1. Then, the adder 3 supplies a sum y(n) to the slicer 4A and the subtracter 5.

The sum y(n) serves as an equalization signal as the output of this digital filter.

The slicer 4A discriminates if the sum y(n) input from the adder 3 belongs to one of the numerical value regions $G_1$ to $G_8$ or one of the predetermined value regions X shown in FIG. 4, as described above. When the sum y(n) belongs to one of the predetermined value regions X, the slicer 4A outputs a logic signal "1" as the identification signal $D_x$ to be supplied to the reception signal/error selection unit 6; when the sum y(n) does not belong to any of the predetermined numerical value regions X, it outputs a logic signal "0".

On the other hand, when the slicer 4A determines that the sum y(n) output from the adder 3 belongs to one of the numerical value regions $G_1$ to $G_8$, it outputs the central value of the numerical value region to which the sum y(n) belongs to the subtracter 5 and the IIR digital filter 2 as an estimated value w(n). Upon reception of the estimated value w(n), the IIR digital filter 2 performs convolution calculation processing of the input value, and supplies the calculation result $y_2(n)$ to the adder 3.

The reception signal/error selection unit 6 is controlled by the identification signal $D_x$. That is, when the sum y(n) output from the adder 3 belongs to one of the predetermined value regions X, the selection unit 6 supplies the difference between the sum y(n) output from the adder 3 and the estimated value w(n) output from the slicer 4A, i.e., the error value e(n) of the sum y(n) from the estimated value w(n), to the multiplier 7, and the multiplier 7 multiplies the input value with a convergence coefficient α to generate a coefficient sequence $C_k(n)$.

The operation principle of the digital filter of this embodiment will be explained below.

If the signal of a transmission code sequence is an 8 VSB code signal, the slicer 4A discriminates one of the numerical value regions $G_1$ to $G_8$ shown in FIG. 4 to which the received code value u(n) belongs, as described above.

When the slicer 4A determines that the received code value u(n) belongs to, e.g., the numerical value region $G_7$ shown in FIG. 4, the slicer 4A outputs the central value $W_7$ of the numerical value region $G_7$ as an estimated value w(n), and also outputs a logic signal "0" as the identification signal $D_x$ to the reception signal/error selection unit 6.

The reception signal/error selection unit 6 supplies the predetermined value "zero" as an error value to the multiplier 7 under the control of the identification signal $D_x$. In this case, since the error value input to the multiplier 7 is zero, it is determined that the calculation result of a coefficient sequence has converged, and no calculation for updating the coefficient sequence is made, thus maintaining the previous coefficient sequence.

Conversely, when the slicer 4A determines that the received code value u(n) has a signal level belonging to one of the regions X shown in FIG. 4, it outputs a logic signal "1" as the identification signal $D_x$, and outputs one of signal levels $W_1$ and $W_8$ as a discrimination value w(n) of the input code value u(n). The reception signal/error selection unit 6 supplies the error value e(n) output from the subtracter 5 to the multiplier 7. The multiplier 7 makes a calculation for updating the coefficient sequence on the basis of the input error value e(n).

In this case, as described above, the slicer 4A forcibly determines and outputs one of the central values $W_1$ and $W_8$ of the numerical value regions $G_1$ and $G_8$ as an estimated value w(n) of the code value u(n) included in one of the predetermined numerical value regions X. Since most of code values u(n) included in the predetermined numerical value regions X are those belonging to the numerical value region $G_1$ or $G_8$ if they are not disturbed, an estimated value w(n) can be obtained with high precision without causing any discrimination error.

In this case, since the central value $W_1$ or $W_8$ is forcibly determined as the estimated value w(n) for the code value u(n), the direction of error, i.e., the positive or negative sign of the error value e(n) can be correctly obtained. If an input code value u(n) belonging to one of the predetermined numerical value regions X is the one that should belong to a numerical value region other than the numerical value region $G_1$ or $G_8$, e.g., the numerical value region $G_7$, the estimated value w(n) for this input code value u(n) can be determined in a numerical value direction in which the numerical value region $G_7$ to which the code value u(n) should originally belong is present. In this manner, correct determination of the direction of error leads to an improvement in discrimination precision.

As described above, according to the digital filter of the first embodiment, since a coefficient sequence is calculated using only code values belonging to the predetermined numerical value regions X shown in FIG. 4, a code sequence can be updated using codes about ⅛ the entire code sequence. For example, a signal of the ATV (Advanced TeleVision) system planned to be broadcast in U.S.A. includes a training sequence at a ratio of 1/300. With this embodiment, a coefficient sequence calculation can be executed using signal information about 40 times that of this system. Therefore, according to the digital filter of this embodiment, the calculation convergence time can be remarkably shortened.

Since a coefficient sequence is updated using only a code signal belonging to the predetermined numerical value regions X shown in FIG. 4, a high-precision estimated value can be obtained. Therefore, as compared to a symbol decision method in which the calculation result diverges upon occurrence of the considerable intersymbol interference, the convergence precision can be greatly improved.

Figure 5:
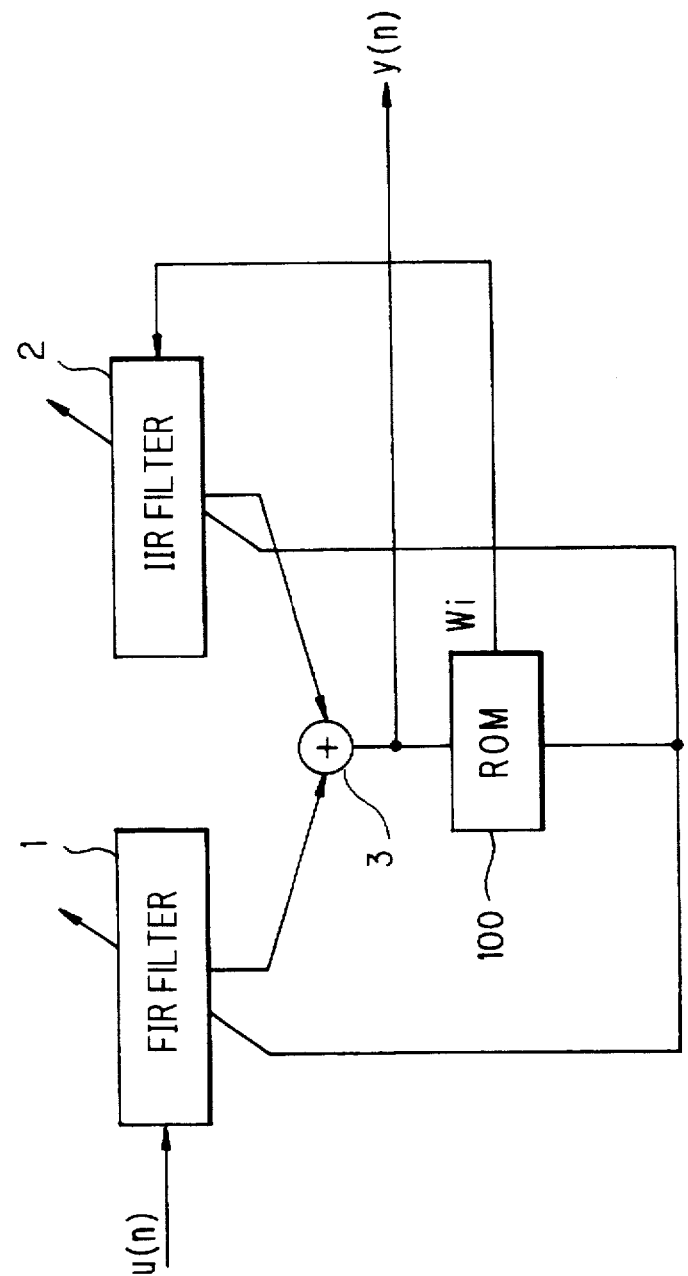
FIG. 5 is a block diagram showing another arrangement of an adaptive digital filter according to the first embodiment of the present invention.

Note that the digital filter of this embodiment can be constituted using a ROM (Read Only Memory). More specifically, as shown in FIG. 5, the slicer 4A, the subtracter 5, the reception signal/error selection unit 6, and the multiplier 7 are replaced by a ROM 100 that receives as an address the sum y(n) output from the adder 3 shown in FIG. 3, and the calculation processing results of these slicer 4A, subtracter 5, reception signal/error selection unit 6, and multiplier 7 can be written in advance as tables in the ROM 100.

In this digital filter, coefficient sequences corresponding to every calculation result of the adder 3 must be held in the ROM 100, and the correspondence between the calculation result of the adder 3 and the output from the ROM 100 must be determined in accordance with the above-mentioned LMSE algorithm. Note that any other type of storage may be used in place of the ROM 100 shown in FIG. 5 to realize the same arrangement, needless to say.

(Second Embodiment)

Figure 6:
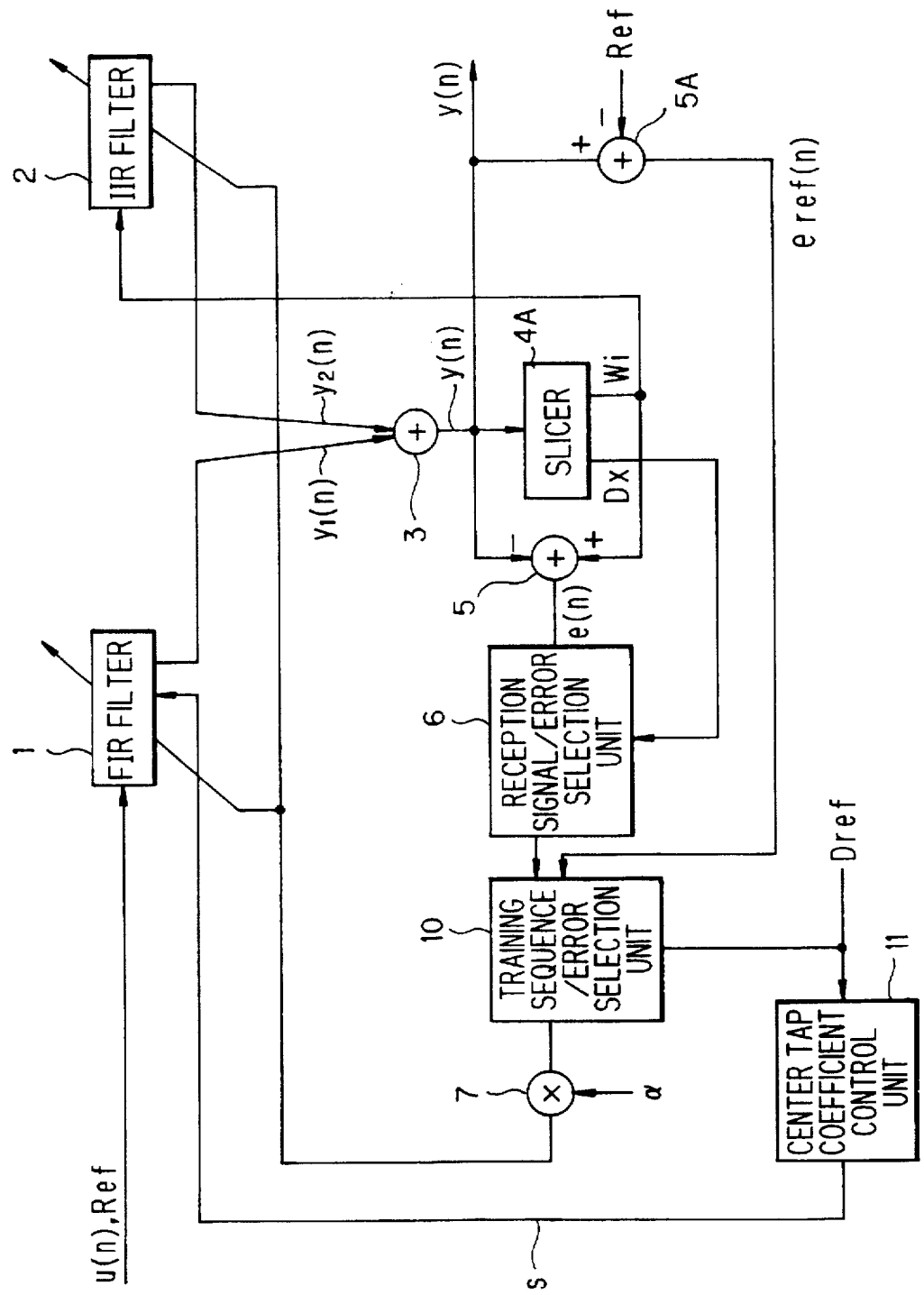
FIG. 6 is a block diagram showing the arrangement of an adaptive digital filter according to the second embodiment of the present invention.

FIG. 6 is a block diagram showing the arrangement of an adaptive digital filter according to the second embodiment of the present invention.

The digital filter of this embodiment has substantially the same arrangement as that of the digital filter of the first embodiment shown in FIG. 3, except that the digital filter of this embodiment comprises a subtracter 5A for calculating the difference between a training sequence Ref and an output signal y(n) from the adder 3, a training sequence/error selection unit 10 which is connected to the output side of the reception signal/error selection unit 6, selects the output from the subtracter 5A during the input period of the training sequence Ref, and selects the output from the reception signal/error selection unit 6 during other periods, and a center tap coefficient control unit 11 for controlling to attain a state in which the center tap coefficients of the FIR digital filter 1 and the IIR digital filter 2 are updated, during the input period of the training sequence Ref.

Figure 7A:
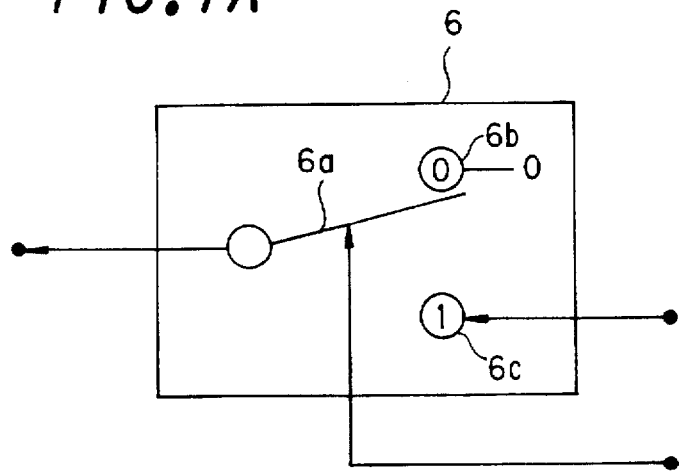
FIG. 7A is a diagram showing the structure of a reception signal/error selection unit.
Figure 7B:
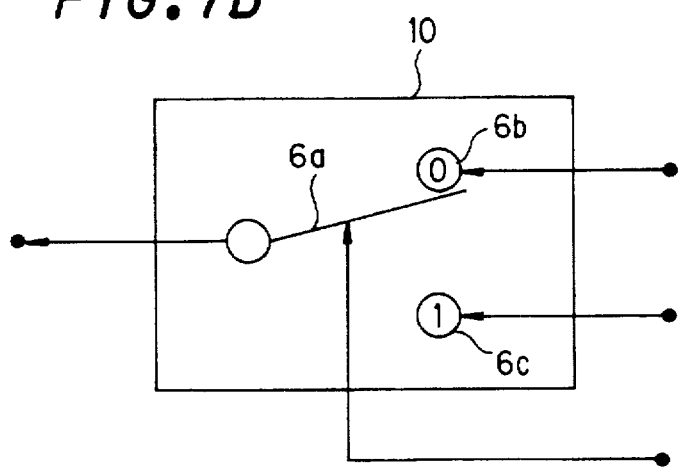
FIG. 7B is a diagram showing the structure of a training sequence/error selection unit.
Figure 7C:
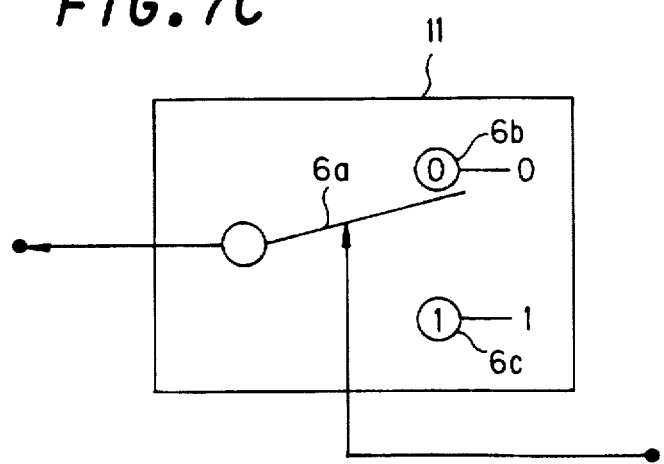
FIG. 7C is a diagram showing the structure of a center tap coefficient control unit.

FIGS. 7A to 7C respectively show the detailed arrangements of the reception signal/error selection unit 6, the training sequence/error selection unit 10, and the center tap coefficient control unit 11. As shown in FIG. 7A, the reception signal/error selection unit 6 is constituted by a movable contact 6a and stationary contacts 6b and 6c. The stationary contact 6b receives a logic signal "0", and the stationary contact 6c receives an error value e(n) from the subtracter 5. The movable contact 6a is controlled by an identification signal $D_x$ output from the slicer 4A, and selects one of the logic signal "0" and the error value e(n) and supplies it to the output terminal.

The training sequence/error selection unit 10 and the center tap coefficient control unit 11 respectively shown in FIGS. 7B and 7C have arrangements similar to that of the selection unit 6. The training sequence/error selection unit 10 shown in FIG. 7B selects one of the output from the reception signal/error selection unit 6 and a training sequence error value $e_{ref}(n)$ under the control of a training sequence period identification signal Dref, and supplies the selected value to the output terminal. On the other hand, the center tap coefficient control unit 11 shown in FIG. 7C selects one of logic signals "1" and "0" under the control of the training sequence period identification signal Dref, and supplies the selected signal to the output terminal.

The operation of the adaptive digital filter of this embodiment with the above-mentioned arrangement will be explained below.

The digital filter of this embodiment shown in FIG. 6 performs substantially the same operations as the digital filter shown in FIG. 3, except that it updates the center tap coefficient of the coefficient sequence on the basis of a training sequence Ref included in advance in a received code sequence U(n). Hence, the updating operation of the center tap coefficient as the characteristic feature of the present invention will be mainly explained.

In the description of the operation, assume that a code sequence received from the transmission path includes a training sequence Ref in advance, as described above, and the code value of a code that the training sequence Ref means, i.e., the signal level, is agreed upon between the transmitter and the receiver in advance. In the following description, the pre-arranged code value corresponding to the signal level of the training sequence Ref will be referred to as a "value of the training sequence".

Referring to FIG. 6, upon reception of the training sequence Ref included in a code sequence, the subtracter 5A calculates the difference between a sum y(n) from the adder 3 as the output from this digital filter and the value of the training sequence, and outputs an error of the sum y(n) with respect to the value of the training sequence, i.e., a training sequence error value $e_{ref}(n)$.

On the other hand, the training sequence/error selection unit 10 selects the training sequence error value $e_{ref}(n)$ output from the subtracter 5A under the control of a training sequence period identification signal Dref, and supplies it to the multiplier 7. The multiplier 7 generates a coefficient sequence on the basis of this training sequence error value $e_{ref}(n)$. At this time, the center tap coefficient control unit 11 outputs a logic signal "1" during the input period of the training sequence and outputs a logic signal "0" during other periods, under the control of the training sequence period identification signal Dref.

The operation of the integrator 42A of the FIR digital filter 1 is controlled in accordance with the logic signal output from the center tap coefficient control unit 11. More specifically, the center tap coefficient is updated on the basis of the training sequence error value $e_{ref}(n)$ during only the input period of the training sequence Ref, and the updating operation of the center tap coefficient is inhibited during other periods.

As described above, since the center tap coefficient is updated using the training sequence Ref included in a code sequence, the calculation convergence time of a coefficient sequence can be further shortened as compared to the case wherein a coefficient sequence is updated using an estimated value as in the digital filter of the first embodiment.

(Third Embodiment)

Figure 8:
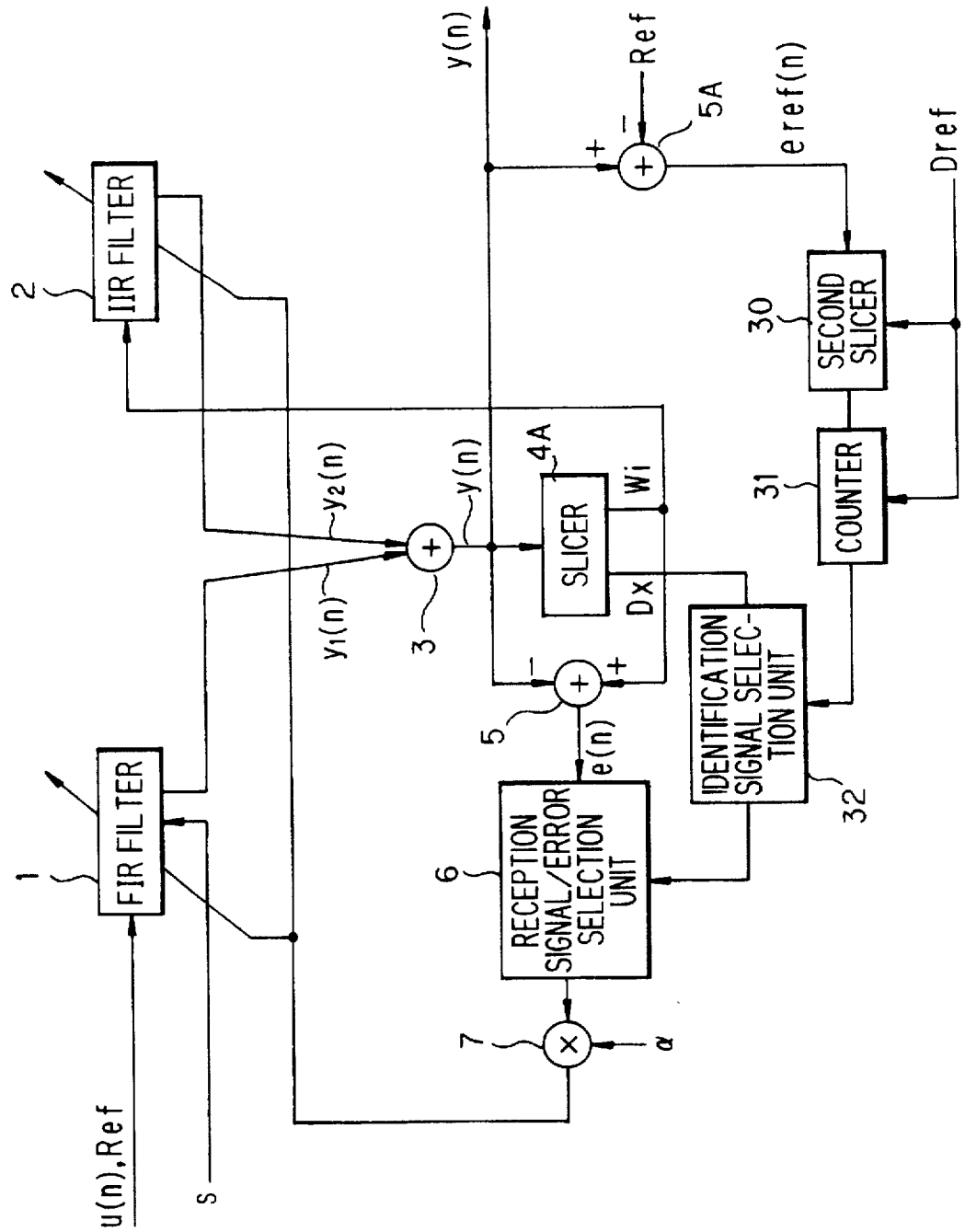
FIG. 8 is a block diagram showing the arrangement of an adaptive digital filter according to the third embodiment of the preset invention.

FIG. 8 is a block diagram showing the arrangement of an adaptive digital filter according to the third embodiment of the present invention.

The digital filter of this embodiment has substantially the same arrangement as that of the digital filter of the first embodiment shown in FIG. 3, except that the digital filter of this embodiment comprises a subtracter 5A for calculating the difference between a training sequence Ref and an output signal y(n) from the adder 3, a second slicer 30 for outputting a logic signal on the basis of the output from the subtracter 5A, a counter 31 for counting the number of "1"s or "0"s of logic signals output from the second slicer 30, and an identification signal selection unit 32 for selecting one of a predetermined logic signal or an identification signal output from the slicer 4A on the basis of the count result, and supplying the selected signal to the reception signal/error selection unit 6.

The operation of the adaptive digital filter of this embodiment with the above-mentioned arrangement will be explained below.

The digital filter of this embodiment shown in FIG. 8 performs substantially the same operations as in the digital filter shown in FIG. 3, except that it discriminates the convergence/non-convergence of a training sequence Ref included in a received code sequence, and selects an error value used in the calculation process of a coefficient sequence on the basis of the discrimination result.

The coefficient sequence generation operation based on the discrimination result of the convergence/non-convergence of a training sequence as the characteristic feature of the present invention will be explained in detail below.

In the following description of this embodiment as well, assume that the code sequence received from the transmission path includes a training sequence Ref in advance, the pre-arranged code value corresponding to the signal level of a training sequence Ref will be referred to as a "value of the training sequence", as in the above embodiment.

Referring to FIG. 8, upon reception of a training sequence Ref included in a code sequence, the subtracter 5A calculates the difference between a sum y(n) from the adder 3 as the output from this digital filter and the value of the training sequence, and outputs an error of the sum y(n) with respect to the value of the training sequence, i.e., a training sequence error value $e_{ref}(n)$.

The second slicer 30 compares the training sequence error value eref(n) output from the subtracter 5A with a predetermined allowable error amount during only the input period of the training sequence Ref. When the training sequence error value $e_{ref}(n)$ is smaller than the predetermined allowable error amount, the slicer 30 outputs a logic signal "1"; otherwise, it outputs a logic signal "0". Note that this predetermined allowable error amount is preferably set to be a value smaller than the intersymbol distance of a transmission code sequence.

The counter 31 receives the logic signal output from the second slicer 30, and counts one of the values "1" and "0" of the logic signal. The counter 31 is set in one of the following two operation modes in accordance with the count result, so as to determine which of logic signals "1" and "0" is to be counted in the next count operation.

More specifically, the first mode is the divergence mode in which the value of the training sequence Ref is determined to change from a divergent state to a convergent state. In this divergence mode, the counter 31 counts logic values "1" output from the second slicer 30 to detect convergence of the value of the training sequence. Note that the initial state of the counter 31 is set to count "1" On the other hand, the second mode is the convergence mode in which the value of the training sequence Ref is determined to change from a convergent state to a divergent state. In this convergence mode, the counter 31 counts logic values "0" output from the second slicer 30 to detect divergence of the value of the training sequence.

When the count value of logic signals "1" of the counter 31 has exceeded a predetermined value in the divergence mode, the counter 31 determines that the training sequence Ref is in the convergent state, and outputs an operation inhibition signal to the identification signal selection unit 32. Upon reception of the operation inhibition signal, the identification signal selection unit 32 supplies a logic signal "1" to the reception signal/error selection unit 6. In this case, the reception signal/error selection unit 6 supplies an error value e(n) output from the subtracter 5 to the multiplier 7 at its output side under the control of the logic signal "1" as an identification signal.

Thereafter, even after an elapse of the input period of the training sequence Ref, the reception signal/error selection unit 6 supplies the error value e(n) output from the subtracter 5 to the multiplier 7, and the multiplier 7 performs an updating calculation of a coefficient sequence on the basis of the error value e(n), as described above.

When the next input period of the training sequence Ref has been reached, the operation mode is similarly discriminated. In this case, if the convergence mode was determined in the discrimination operation of the previous training sequence input period, the counter 31 counts logic values "0" output from the second slicer 30 during the current training sequence input period, so as to detect divergence of the training sequence Ref.

When the count value of logic signals "0" output from the second slicer 30 has reached a predetermined value, the counter 31 determines that the training sequence Ref is in the divergent state, and outputs an operation cancel signal to the identification signal selection unit 32. Upon reception of the operation cancel signal, the identification signal selection unit 32 supplies an identification signal $D_x$ output from the slicer 4A to the reception signal/error selection unit 6. In this case, the reception signal/error selection unit 6 supplies one of a predetermined value (e.g., zero) and an error value e(n) output from the subtracter 5 to the multiplier 7 at its output side under the control of the identification signal $D_x$ supplied from the slicer 4A.

When the counter 31 counts logic values "1" or "0" from the second slicer, the previous count result must be deleted for each input period of the training sequence Ref. For example, when a channel is switched, and a large training sequence error value that considerably exceeds the allowable error amount is input to the second slicer 30, the second slicer 30 may output a logic signal "0". In this case, the divergence mode is undesirably set based on a factor other than the training sequence. For this reason, once the output from the counter 31 is determined during the input period of a certain training sequence independently of the convergence or divergence mode, the determined state must be forcibly held until the next training sequence is input.

As described above, according to the digital filter of this embodiment, since the convergence/non-convergence of a training sequence included in a received code sequence is monitored, the updating calculation of a coefficient sequence is performed using only received codes which are in a convergent state to some extent, and after the calculation of this coefficient sequence converges to some extent, the coefficient sequence is updated using all the received codes, thus further shortening the convergence time.

(Fourth Embodiment)

Figure 9:
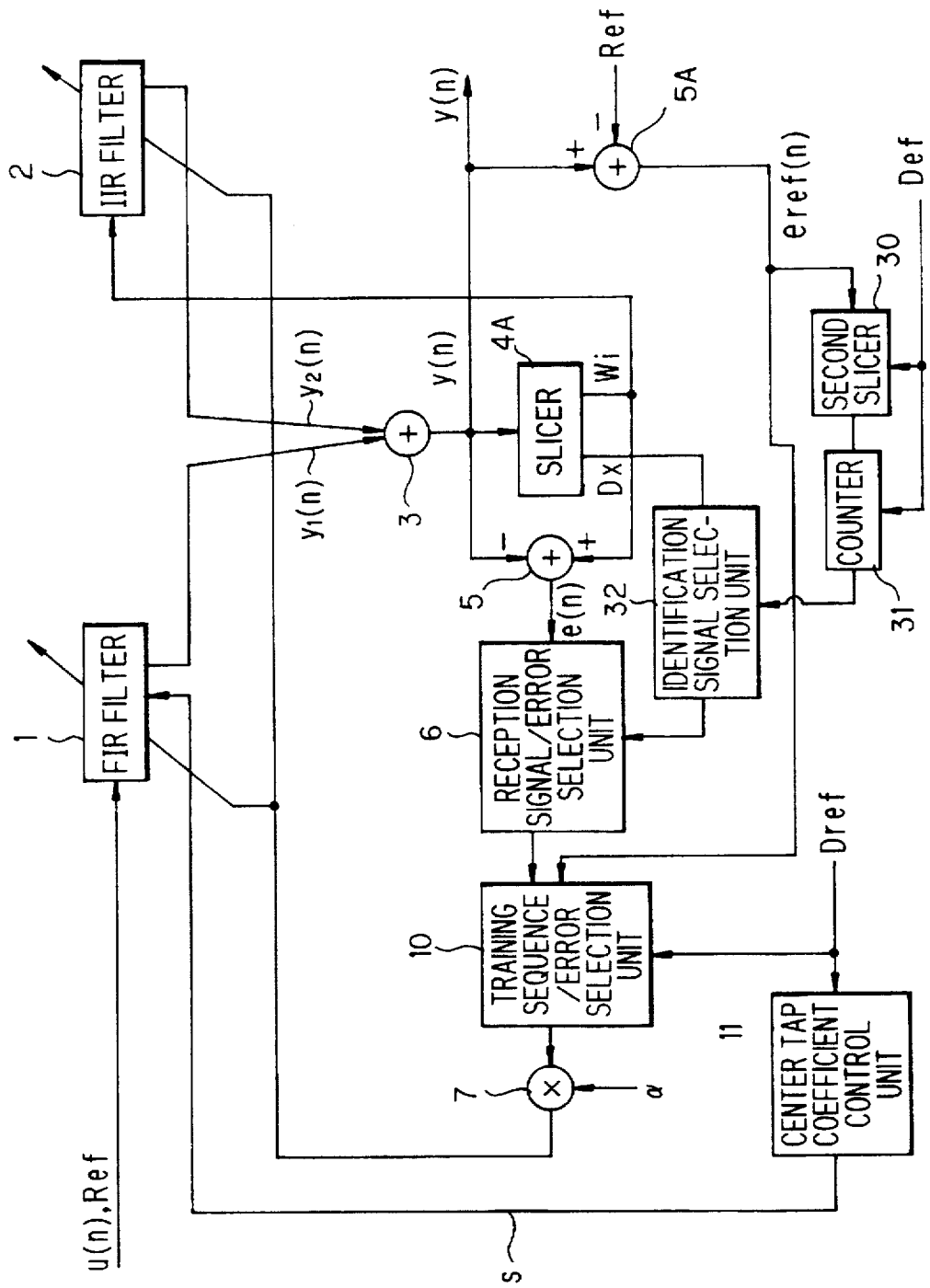
FIG. 9 is a block diagram showing the arrangement of an adaptive digital filter according to the fourth embodiment of the present invention.

FIG. 9 is a block diagram showing the arrangement of an adaptive digital filter according to the fourth embodiment of the present invention.

The digital filter of this embodiment is constituted by adding the second slicer 30, the counter 31, and the identification signal selection unit 32 which constitute the digital filter shown in FIG. 8 to the digital filter shown in FIG. 6.

More specifically, the digital filter of this embodiment shown in FIG. 9 has substantially the same arrangement as that of the digital filter shown in FIG. 6, except that it additionally comprises a second slicer 30 for outputting a logic signal on the basis of the output from the subtracter 5A, a counter 31 for counting the number of logic values "1" or "0" of logic signals output from the second slicer 30, and an identification signal selection unit 32 for selecting one of an identification signal $D_x$ output from the slicer 4A and a predetermined logic signal on the basis of the count result, and supplying the selected signal to the reception signal/error selection unit 6.

The adaptive digital filter of this embodiment with this arrangement has the operations of both the second and third embodiments described above. More specifically, the digital filter of this embodiment updates the center tap coefficient of a coefficient sequence on the basis of a training sequence Ref included in a received code sequence U(n). In addition, the digital filter of this embodiment discriminates the convergence/non-convergence of the training sequence Ref included in the received code sequence during the input period of the training sequence Ref, and selects an error value to be used in the calculation process of a coefficient sequence on the basis of the discrimination result.

Therefore, according to the digital filter of this embodiment, since the center tap coefficient is updated using the training sequence Ref, and the updating calculation of a coefficient sequence is performed using only received codes which are in a convergent state to some extent by monitoring the convergence/non-convergence of the training sequence Ref, a coefficient updating calculation is performed using all the received codes after the coefficient sequence calculation converge to some extent. For this reason, the calculation convergence time of a coefficient sequence can be further shortened as compared to the digital filter of the second or third embodiment.

The above-mentioned digital filter of each of the first to fourth embodiments is constituted using both FIR and IIR digital filters, but may be constituted using either one of these filters. In this case, the adder 3 shown in FIGS. 3, 5, 6, 8, or 9 may be omitted, and the calculation result of the FIR or IIR digital filter may be input to the slicer 4A and the subtracter 5.

As can be seen from the above description, according to the present invention, the following effects can be obtained.

According to the inventions of the first and third aspects, since the coefficient sequence is updated using a code value that belongs to the predetermined numerical value region other than the numerical value regions which are agreed upon in advance in correspondence with the code values, the estimation precision of a code can be remarkably improved, and the convergence time of the coefficient sequence calculation can be shortened.

According to the inventions of the second and fourth aspects, since the adaptive digital filter comprises both a finite impulse response digital filter and an infinite impulse response digital filter, an increase in linear noise caused during the calculation process of the coefficient sequence can be suppressed in addition to the effect of the inventions of the first and third aspects.

According to the invention of the fifth aspect, since the center tap coefficient is updated using a training sequence, the convergence precision of the coefficient sequence can be further improved, and the convergence time of the coefficient sequence calculation can be further shortened.

According to the invention of the sixth aspect, since the adaptive digital filter comprises both a finite impulse response digital filter and an infinite impulse response digital filter, an increase in linear noise caused during the calculation process of the coefficient sequence can be suppressed in addition to the effect of the invention of the fifth aspect.

According to the invention of the seventh aspect, since the convergence state of the reception signal is discriminated on the basis of the training sequence included in advance in the reception signal, calculation processing can be performed using only highly convergent codes, and the convergence time of the coefficient sequence calculation can be further shortened.

According to the invention of the eighth aspect, both the effects of the inventions of the fifth and seventh aspects can be obtained. Furthermore, the convergence precision of the coefficient sequence can be further improved, and the convergence time of the coefficient sequence calculation can be further shortened.

According to the inventions of the ninth and 10th aspects, since the predetermined numerical value region other than the numerical value regions that are agreed upon in advance in correspondence with the code values is set to be a numerical value region with a value larger than the value of the numerical value region whose absolute value corresponds to the maximum code value, the coefficient updating calculation can be performed using a larger number of code values than in the conventional training sequence method that utilizes a training sequence included at a very small ratio in the total transmission signal, thus greatly shortening the convergence time of the coefficient sequence calculation.

According to the invention of the 11th aspect, since the coefficient sequence is calculated to minimize the error value, the coefficient sequence can be generated to remove disturbance signal components included in a code sequence.

What is claimed is:

1. An adaptive digital filter for removing intersymbol interference generated in a code sequence in a transmission path, comprising:

finite impulse response digital filter means for performing a convolution calculation by multiplying the code sequence with a coefficient sequence; and coefficient calculation means for generating, when a calculation result from said finite impulse response digital filter means belongs to a predetermined numerical value region other than a plurality of numerical value regions which are defined in advance in correspondence with code values of the code sequence, the coefficient sequence on the basis of a predetermined value which belongs to one of the plurality of numerical value regions closest to the predetermined numerical value region.

2. An adaptive digital filter for removing intersymbol interference generated in a code sequence in a transmission path, comprising:

finite impulse response digital filter means for performing a convolution calculation by multiplying the code sequence with a coefficient sequence;

addition means for receiving a calculation result from said finite impulse response digital filter means as one input value and adding another input value to the one input value;

coefficient calculation means for generating, when a sum output from said addition means belongs to a predetermined numerical value region other than a plurality of numerical value regions which are defined in advance in correspondence with code values of the code sequence, the coefficient sequence on the basis of a predetermined value which belongs to one of the plurality of numerical value regions closest to the predetermined numerical value region, and for generating, when the sum output from said addition means belongs to one of the plurality of numerical value regions, the coefficient sequence on the basis of a predetermined value that belongs to the numerical value region to which the sum output belongs; and infinite impulse response digital filter means for performing a convolution calculation by multiplying a sequence of the predetermined values with the coefficient sequence and supplying a calculation result from said infinite impulse response digital filter means to said addition means as the another input value.

3. The adaptive digital filter according to claim 1, wherein said coefficient calculation means comprises:

a discrimination unit for discriminating a numerical value region of the plurality of numerical value regions defined in advance to which the calculation result of said finite impulse response digital filter means belongs in correspondence with the code values of the code sequence, outputting a predetermined value that belongs to the discriminated numerical value region, and outputting an identification signal for identifying whether or not the calculation result belongs to the predetermined numerical value region;

an error calculation unit for calculating a difference between the calculation result and the predetermined value output by said discrimination unit and outputting an error value;

a selection unit for selecting and outputting the error value on the basis of the identification signal; and a coefficient sequence generation unit for generating the coefficient sequence on the basis of an output from said selection unit.

4. The adaptive digital filter according to claim 2, wherein said coefficient calculation means comprises:

a discrimination unit for discriminating a numerical value region of the plurality of numerical value regions defined in advance to which the sum output from said addition means belongs in correspondence with the code values of the code sequence, outputting a predetermined value that belongs to the discriminated numerical value region, and outputting an identification signal for identifying whether or not the sum output belongs to the predetermined numerical value region;

an error calculation unit for calculating a difference between the sum output and the predetermined value output by said discrimination unit and outputting an error value;

a selection unit for selecting and outputting the error value on the basis of the identification signal; and a coefficient sequence generation unit for generating the coefficient sequence on the basis of an output from said selection unit.

5. The adaptive digital filter according to claim 1 or 2, wherein said coefficient calculation means updates a central value in the coefficient sequence on the basis of an error value of the calculation result from said finite impulse response digital filter means with respect to a training sequence included in the code sequence during an input period of the training sequence.

6. The adaptive digital filter according to claim 3 or 4, wherein aid coefficient sequence generation unit updates a central value in the coefficient sequence on the basis of an error value of the calculation result from said finite impulse response digital filter means with respect to a training sequence included in the code sequence during an input period of the training sequence.

7. The adaptive digital filter according to claim 3 or 4, wherein said selection unit selects the error value on the basis of convergence/non-convergence of a training sequence included in the code sequence; during an input period of the training sequence, independently of the identification signal.

8. The adaptive digital filter according to claim 3 or 4, wherein said selection unit selects the error value on the basis of convergence/non-convergence of a training sequence included in the code sequence, during an input period of the training sequence, independently of the identification signal, and said coefficient sequence generation unit updates a central value in the coefficient sequence on the basis of an error value of the calculation result from said finite impulse response digital filter means with respect to the training sequence during the input period of the training sequence.

9. The adaptive digital filter according to claim 1 or 2, wherein the predetermined numerical value region is a numerical value region having a value larger than a value that belongs to the numerical value region defined in correspondence with a code value with a maximum absolute value.

10. The adaptive digital filter according to claim 3 or 4, wherein the predetermined numerical value region is a numerical value region having a value larger than a value that belongs to the numerical value region defined in correspondence with a code value with a maximum absolute value.

11. The adaptive digital filter according to claim 3 or 4, wherein said coefficient sequence generation unit generates the coefficient sequence to minimize the error value.

12. A method of adaptive digital filtering for removing intersymbol interference generated in a code sequence in a transmission path, comprising the steps of:

a) digitally filtering the code sequence by performing a convolution calculation comprising multiplying the code sequence with a coefficient sequence; and b) generating the coefficient sequence, when a calculation result of said step a) belongs to a predetermined numerical value region other than a plurality of numerical value regions which are defined in advance in correspondence with code values of the code sequence, on the basis of a predetermined value which belongs to one of the plurality of numerical value regions closest to the predetermined numerical value region.

13. A method of adaptive digital filtering for removing intersymbol interference generated in a code sequence in a transmission path, comprising the steps of:

a) digitally filtering the code sequence by performing a convolution calculation comprising multiplying the code sequence with a coefficient sequence;

b) adding a calculation result from aid step a) as one input value with another input value;

c) generating the coefficient sequence, when a sum output from said step b) belongs to a predetermined numerical value region other than a plurality of numerical value regions which are defined in advance in correspondence with code values of the code sequence, on the basis of a predetermined value which belongs to one of the plurality of numerical value regions closest to the predetermined numerical value region;

d) generating the coefficient sequence, when the sum output from said step b) belongs to one of the plurality of numerical value regions, on the basis of a predetermined value that belongs to the numerical value region to which the output belongs;

e) digitally filtering a sequence of the predetermined values by performing a convolution calculation comprising multiplying the sequence of the predetermined values with the coefficient sequence; and f) supplying a calculation result of said step e) as the another input value of said step b).

* * * * *